(12) United States Patent
Tomita

(10) Patent No.: US 7,626,881 B2
(45) Date of Patent: Dec. 1, 2009

(54) SEMICONDUCTOR MEMORY DEVICE CONTAINING ANTIFUSE WRITE VOLTAGE GENERATION CIRCUIT

(75) Inventor: Hiroyoshi Tomita, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 132 days.

(21) Appl. No.: 11/889,672

(22) Filed: Aug. 15, 2007

(65) Prior Publication Data

US 2008/0043510 A1    Feb. 21, 2008

(30) Foreign Application Priority Data

Aug. 16, 2006   (JP)   ............... 2006-221774

(51) Int. Cl.
*G11C 17/18* (2006.01)
(52) U.S. Cl. ............... 365/225.7; 365/96; 365/226; 365/227
(58) Field of Classification Search ............. 365/226, 365/227, 225.7, 96
See application file for complete search history.

(56) References Cited

U.S. PATENT DOCUMENTS

| | | | | |
|---|---|---|---|---|
| 5,448,187 A | * | 9/1995 | Kowalski | 326/81 |
| 5,495,436 A | * | 2/1996 | Callahan | 365/96 |
| 5,604,694 A | * | 2/1997 | Callahan | 365/96 |
| 5,790,448 A | * | 8/1998 | Merritt et al. | 365/96 |
| 5,821,771 A | * | 10/1998 | Patel et al. | 326/38 |
| 5,838,625 A | | 11/1998 | Cutter et al. | |
| 5,896,041 A | * | 4/1999 | Sher et al. | 326/38 |
| 5,991,221 A | * | 11/1999 | Ishikawa et al. | 365/226 |
| 6,088,281 A | * | 7/2000 | Miyakawa et al. | 365/225.7 |
| 6,108,246 A | * | 8/2000 | Umezawa et al. | 365/189.09 |
| 6,128,241 A | * | 10/2000 | Choi | 365/225.7 |
| 6,144,247 A | * | 11/2000 | Kim et al. | 327/525 |
| 6,240,033 B1 | * | 5/2001 | Yang et al. | 365/225.7 |
| 6,266,291 B1 | * | 7/2001 | Sher et al. | 365/226 |
| 6,278,651 B1 | | 8/2001 | Weinfurtner et al. | |
| 6,304,498 B1 | * | 10/2001 | Ikeda | 365/200 |
| 6,418,067 B1 | * | 7/2002 | Watanabe et al. | 365/200 |
| 6,515,934 B2 | * | 2/2003 | Kobayashi et al. | 365/226 |

(Continued)

FOREIGN PATENT DOCUMENTS

EP    1 024 431 A2    8/2000

(Continued)

OTHER PUBLICATIONS

Jae-Kyung Wee, et al., "An Antifuse EPROM Circuitry Scheme for Field-Programmable Repair in Dram", IEEE Journal of Solid-State Circuits, vol. 35, No. 10, Oct. 1, 2000, pp. 1408-1414.

(Continued)

*Primary Examiner*—Viet Q Nguyen
(74) *Attorney, Agent, or Firm*—Arent Fox LLP

(57) ABSTRACT

A semiconductor memory device that enables the reduction of the circuit scale of the antifuse write voltage generation circuit. The semiconductor memory device has a first internal power supply generation circuit that boosts an external power supply voltage to generate a first internal power supply, a memory core to which the first internal power supply is supplied, an antifuse memory for writing predetermined information, and also a write voltage generation circuit that boosts the first internal power supply to generate an antifuse write voltage.

16 Claims, 13 Drawing Sheets

U.S. PATENT DOCUMENTS

| | | | |
|---|---|---|---|
| 6,724,242 B2 | 4/2004 | Kim et al. | |
| 6,775,171 B2 * | 8/2004 | Novosel et al. | 365/96 |
| 6,831,294 B1 * | 12/2004 | Nishimura et al. | 257/48 |
| 6,836,145 B2 * | 12/2004 | Mecier et al. | 326/38 |
| 7,256,641 B2 * | 8/2007 | Namekawa et al. | 327/536 |
| 7,349,281 B2 * | 3/2008 | Kouchi et al. | 365/225.7 |
| 7,388,770 B2 * | 6/2008 | Namekawa et al. | 365/94 |
| 2003/0006832 A1 | 1/2003 | Ikehashi et al. | |

FOREIGN PATENT DOCUMENTS

| | | |
|---|---|---|
| EP | 0 124 431 A3 | 9/2000 |
| JP | 07-287992 A | 10/1995 |
| JP | 020000208637 A * | 7/2000 |
| JP | 020001210094 A * | 8/2001 |
| JP | 2004-013930 A | 1/2004 |
| KR | 2003-94676 | 12/2003 |

OTHER PUBLICATIONS

Korean Office Action dated Feb. 27, 2009.

* cited by examiner

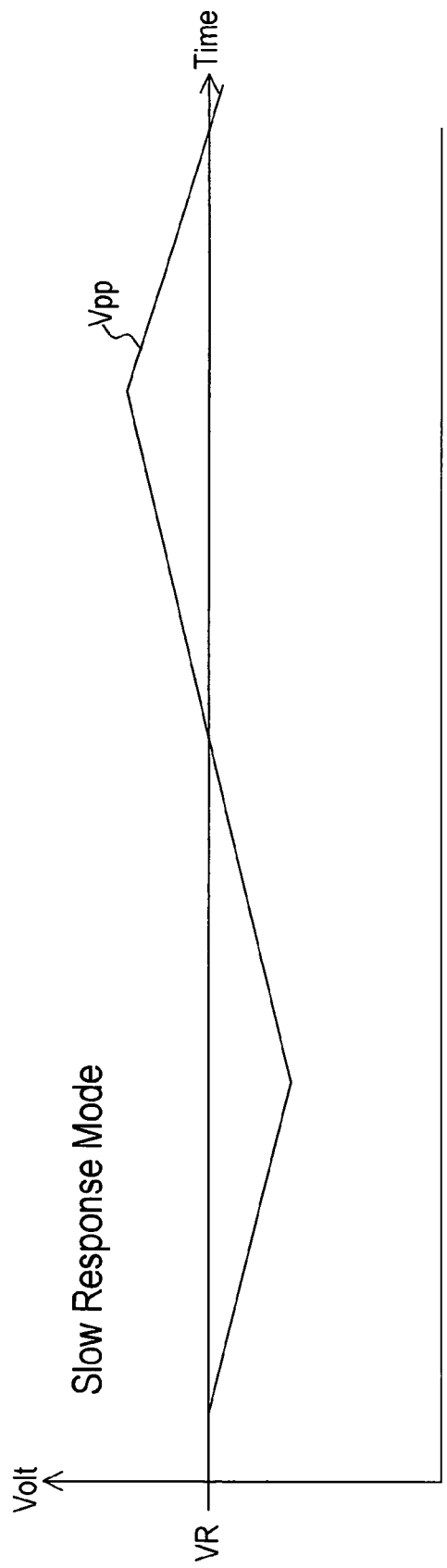
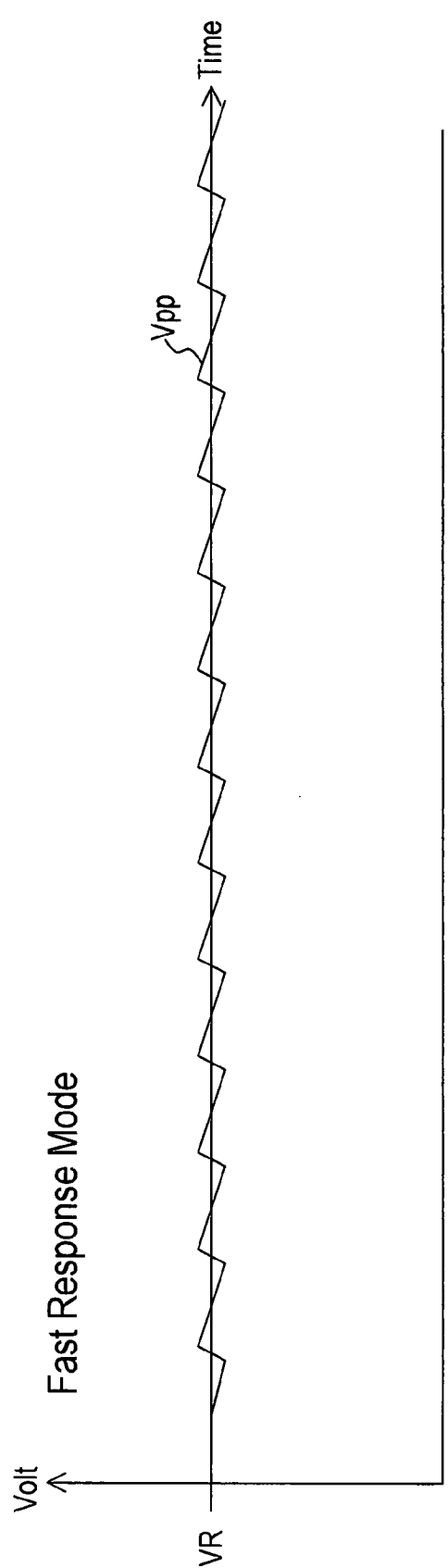

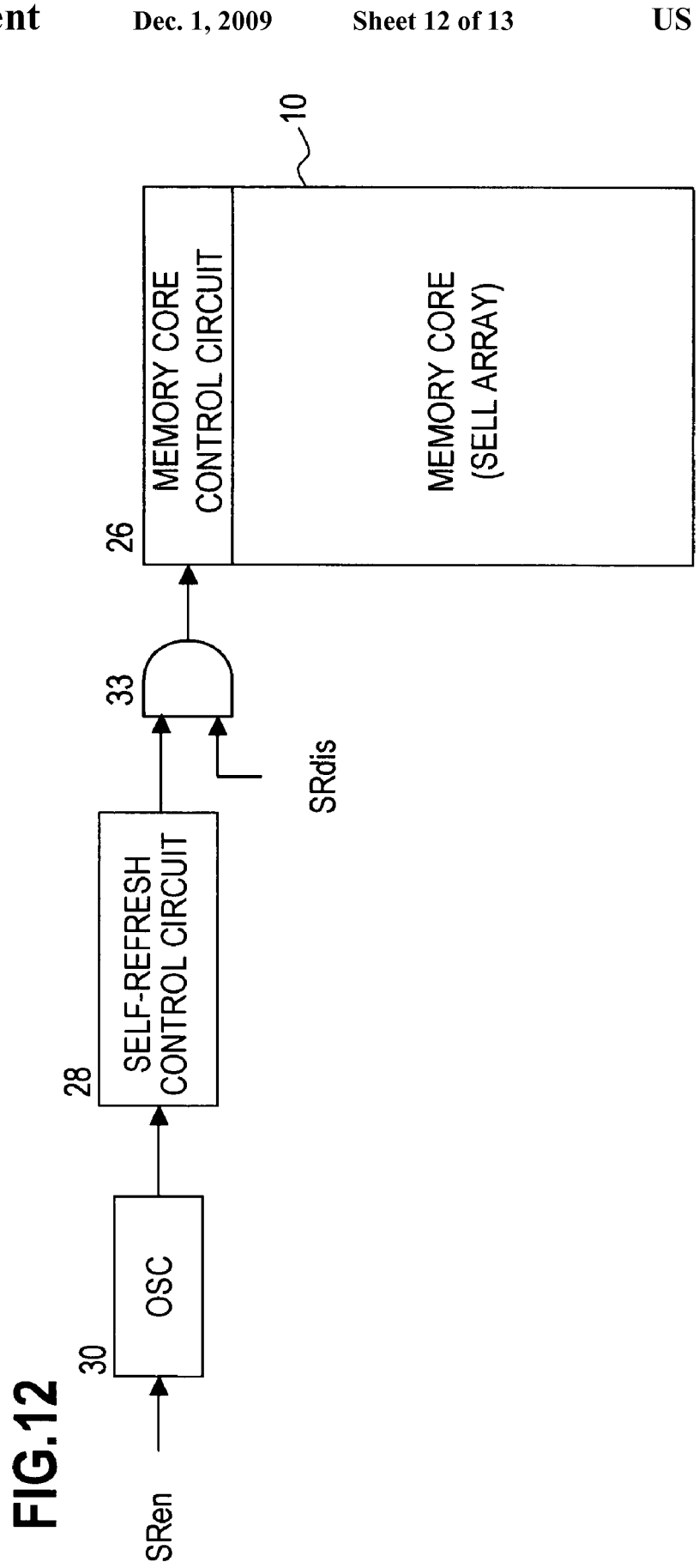

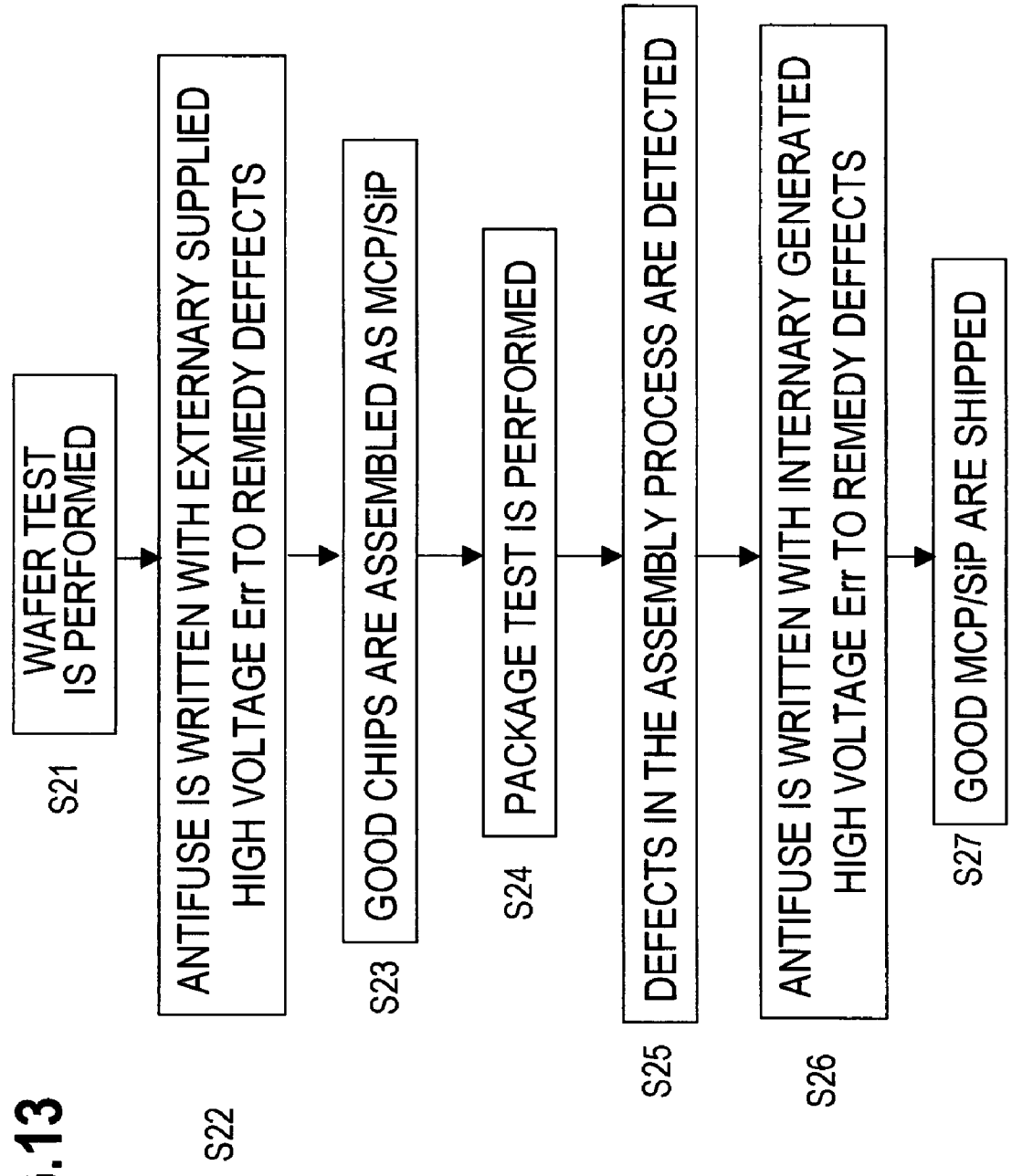

SEMICONDUCTOR MEMORY DEVICE CONTAINING ANTIFUSE WRITE VOLTAGE GENERATION CIRCUIT

CROSS-REFERENCE TO RELATED APPLICATIONS

This application is based upon and claims the benefit of priority from the prior Japanese Patent Application No. 2006-221774, filed on Aug. 16, 2006, the entire contents of which are incorporated herein by reference.

BACKGROUND OF THE INVENTION

1. Field of the Invention

The present invention relates to a semiconductor memory device containing an antifuse write voltage generation circuit, and more particularly to a semiconductor memory device in which the circuit scale of the antifuse write voltage generation circuit is reduced.

2. Description of the Related Art

In a large-capacity semiconductor memory, in particular DRAM, a redundant memory is provided to increase yield, and the columns or words where a defective bit is present are replaced with the redundant memory. Further, in semiconductor memories, a level of a high-potential internal power supply that is generated inside the memory is finely adjusted or the impedance of the output transistor is finely adjusted. The replacement with the redundant memory is performed by writing into a ROM the address information indicating which defective bit is to be replaced, and fine adjustment of the level or impedance is also performed by writing the fine adjustment information into the ROM.

A fuse ROM has been widely used for the ROM for writing the information at the final stage of the manufacturing process. For example, this is described in Japanese Patent Application Laid-open No. 07-287992, Japanese Patent Application Laid-open No. 2004-13930. In other words, the necessary information is written by irradiating a fuse element with a laser and blowing and cutting the fuse element.

Such fuse element ROM has the following limitations. Thus, a large-scale laser irradiation device is required and fuse melting can be performed only at the wafer stage.

Accordingly, an antifuse element ROM has recently been suggested to replace the fuse ROM. An antifuse has a configuration basically identical to a capacitor. In a non-writing state, the two terminals of the antifuse are open, and if writing is performed, the dielectric layer of the capacitor is short circuited and the two terminals are in a short circuit state. By using the antifuse, the surface area can be reduced comparing to that of the fuse, a large laser irradiation device becomes unnecessary, writing can be conducted by a high voltage generated internally, writing can therefore be conducted after the assembly process, and yield can be increased. A memory device using such antifuse is described, for example, in Japanese Patent Application Laid-open No. 11-328991.

SUMMARY OF THE INVENTION

Antifuse writing requires the application of a comparatively high voltage. Therefore, a high voltage generation circuit for antifuse writing has to be provided inside the memory device. Because the voltage necessary for writing is higher than the level of the external voltage supplied from the outside, the high voltage generation circuit drives a pump circuit by a clock generated by an oscillator and generates a high voltage by boosting the external power supply.

However, because the antifuse write voltage is substantially higher than the external power supply, the scale of the pump circuit has to be increased, which is a demerit from the standpoint of integration. Moreover, this antifuse write voltage is necessary in the manufacturing process, but is unnecessary in the usual operation. Therefore, increasing the circuit scale of the write voltage generation circuit is undesirable.

Accordingly, it is an object of the present invention to provide a semiconductor memory device in which the circuit scale of the antifuse write voltage generation circuit is reduced.

Further, it is another object of the present invention to provide a semiconductor memory device in which the voltage generated by the high voltage generation circuit for antifuse writing is stabilized.

It is yet another object of the present invention to provide a semiconductor memory device in which the boost time of the high voltage generation circuit for antifuse writing is shortened and the effect on the internal memory associated therewith is avoided.

In order to attain the above-described object, the present invention, in accordance with the first aspect thereof, provides a semiconductor memory device having a first internal power supply generation circuit that boosts an external power supply voltage to generate a first internal power supply, a memory core to which the first internal power supply is supplied, an antifuse memory that writing predetermined information is written, and further a write voltage generation circuit that boosts the first internal power supply to generate an antifuse write voltage.

With such a configuration, the write voltage generation circuit uses the first internal power supply that is higher than the external power supply generated for use in the memory core to generate a higher write voltage. Therefore the circuit scale of the write voltage generation circuit can be reduced. Information of a variety of types, e.g., information of a defective cell that will be replaced with the redundant cell, information on level adjustment of the internal power supply generation circuit, and information of impedance adjustment of the output circuit is stored in the antifuse memory. Of those types of information, writing of the defective cell information for defective cell remedy is performed not only during the wafer test, but also during the package test after assembling.

In the preferred embodiment of the above-described configuration of the first aspect, the first internal power supply generation circuit is controlled to a slow mode in which a speed of a response operation that causes a first internal power supply level, which is to be boosted, to follow a desired level is decreased when the memory is in a standby state, controlled to a fast mode in which the speed of the response operation is increased and the first internal power supply level is stabilized at the desired level when the memory is active, and forcibly controlled to the fast mode during antifuse writing. As a result, the first internal power supply level is stabilized during antifuse writing, the write voltage that is generated by boosting the first internal power supply is also stabilized, and reliability of antifuse writing is increased.

In another preferred embodiment of the above-described configuration of the first aspect, the first internal power supply generation circuit is controlled so as to boost the first internal power supply to a first potential when the memory is in an active state, and to boost the first internal power supply to a second potential that is higher than the first potential during antifuse writing. As a result, the first internal power supply that is the source voltage of boost operation is set higher than during usual operation. Therefore, the voltage of the write voltage generation circuit can be boosted to the write voltage within a short interval and the circuit scale can be reduced.

In a memory device in which the first internal power supply is used for a word line drive power supply in the memory core and a self-refresh control circuit is provided that executes a refresh operation at a predetermined period when power is turned on, the control is performed so as to prohibit the operation of the self-refresh control circuit during antifuse writing. Even if the first internal power supply is boosted to a higher second potential, negative effects such as driving the word line at the second potential and breakdown of cell transistors can be prevented by prohibiting the operation of the self-refresh control circuit.

In yet another preferred embodiment of the above-described configuration of the first aspect, a high-voltage external terminal is provided for applying a high voltage for antifuse writing, and in a wafer test, an output of the write voltage generation circuit is set to a high-impedance state, a high voltage for writing is applied from the high-voltage external terminal, and antifuse writing is performed, and in a package test after assembling, a high voltage for writing that is generated by the write voltage generation circuit is applied and antifuse writing is performed.

In order to attain the above-described object, the present invention, in accordance with the second aspect thereof, provides a semiconductor memory device to which an external power supply voltage is applied, having: a first internal power supply generation circuit that boosts the external power supply voltage to generate a first internal power supply; a memory core to which the first internal power supply is supplied; an antifuse memory in which predetermined information is written; and a write voltage generation circuit that boosts the first internal power supply to generate an antifuse write voltage, wherein writing to an antifuse of the antifuse memory is performed by applying said antifuse write voltage.

In order to attain the above-described object, the present invention, in accordance with the third aspect thereof, provides a semiconductor memory device to which an external power supply voltage is applied, having: a first internal power supply-generation circuit that boosts the external power supply voltage to generate a first internal power supply; a second internal power supply generation circuit that generates a second internal power supply that is lower than the first internal power supply from the external power supply voltage; a memory core having a memory array in which a word line is driven by the first internal power supply and the second internal power supply is connected to a capacitor of a memory cell; an antifuse memory in which defective bit remedy information located in the memory array is written; and a write voltage generation circuit that boosts the first internal power supply to generate an antifuse write voltage, wherein writing to an antifuse of the antifuse memory is performed by applying the antifuse write voltage.

The present invention makes it possible to reduce the circuit scale of the write voltage generation circuit that generates a voltage to be applied during writing into the antifuse memory.

BRIEF DESCRIPTION OF THE DRAWINGS

FIG. 11 is a structural diagram illustrating the prohibition of refresh operation in the present embodiment.

FIG. 12 illustrates the waveform of the rising voltage Vpp of the internal power supply generation circuit 22.

FIG. 13 is a flowchart illustrating the relationship between a wafer test and a package test in the present embodiment.

DETAILED DESCRIPTION OF PREFERRED EMBODIMENTS

The embodiments of the present invention will be described hereinbelow with reference to the appended drawings. However, the technological scope of the present invention is not limited to these embodiments and includes the matter described in the claims and equivalents thereof.

Figure 1:
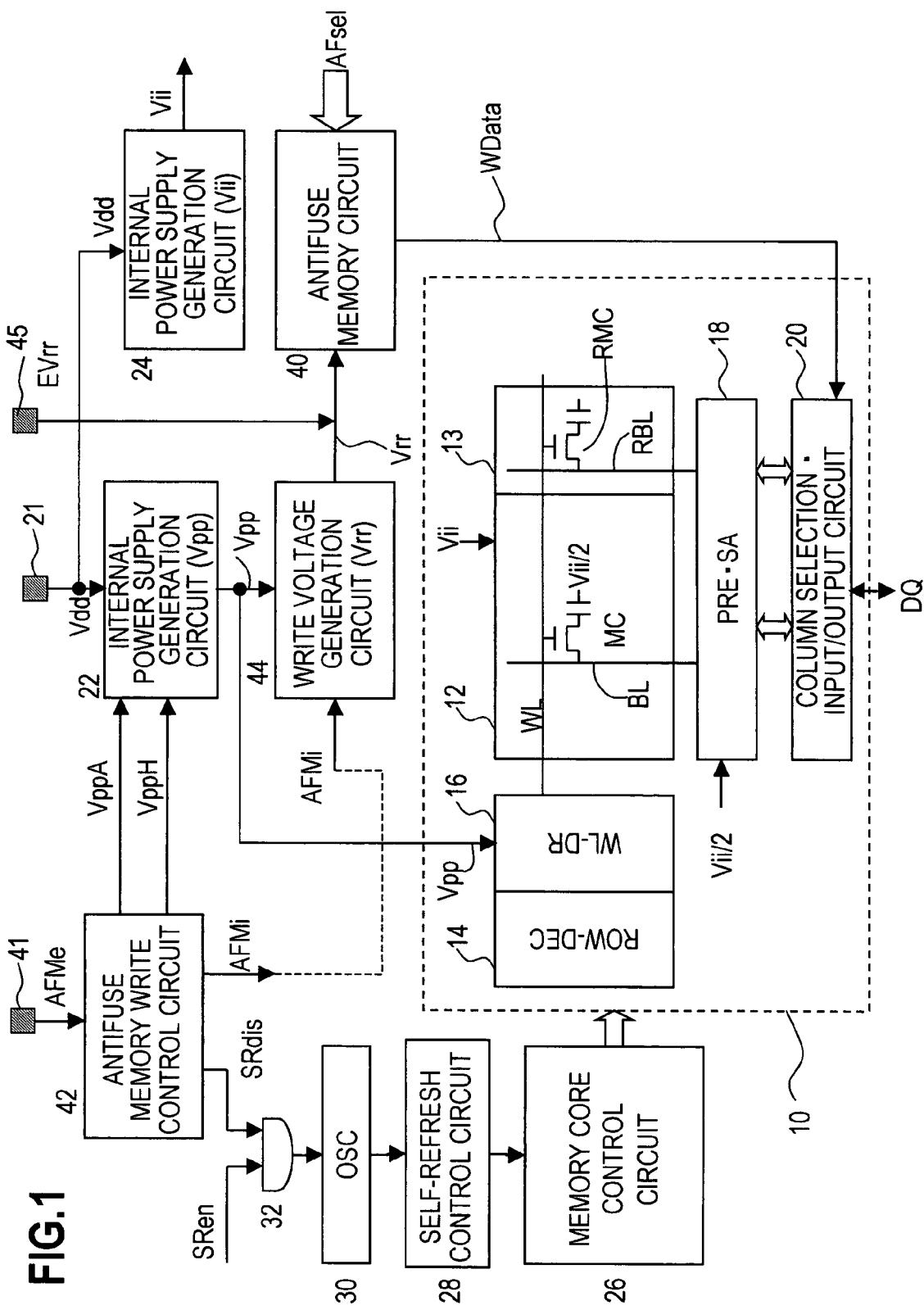
FIG. 1 is a structural drawing of a semiconductor memory device of the present embodiment.

FIG. 1 is a structural drawing of a semiconductor memory device of the present embodiment. Inside a memory core 10, there are provided a ordinary memory cell array 12 having ordinary memory cells MC and a redundant memory cell array 13 having redundant memory cell RMC, a row decoder 14, a word line drive circuit 16 that drives a word line WL selected by the row decoder, a pre-charge—sense amplification circuit 18 that pre-charges a bit line BL and detects a read level, and a column selection—input/output circuit 20 that selects a bit line and performs data input/output. The input/output circuit 20 is connected to a data input/output terminal DQ. Further, the memory cell arrays 12, 13 have a plurality of word lines WL and a plurality of bit lines BL, and memory cells MC, RMC composed of one transistor and one capacitor are provided in the intersections of the word lines and bit lines.

Further, in order to operate the memory core 10, the memory device also has a first internal power supply generation circuit 22 that generates a first internal power supply Vpp by boosting the external power supply Vdd and a second internal power supply generation circuit 24 that generates a stabilized second internal power supply Vii from the external power supply Vdd. As described hereinbelow, if a word line WL is selected, it is driven by the first internal power supply Vpp. Further, the opposing electrodes of the capacitor of the memory cell are connected to a middle potential Vii/2 of the second internal power supply Vii. The pre-charge circuit 18 pre-charges the bit line BL to a Vii/2 level.

A memory core control circuit 26 controls the operations, such as write and read operations, of the memory core 10. Further, a self-refresh control circuit 28 controls refresh operation including work line drive, activation of sense amplifier, and re-writing sequentially via the memory core control circuit 26 in response to a trigger signal generated with a predetermined period by an oscillator 30. Usually, when the external power supply Vdd is started, the self-refresh start signal SRen assumes an activation level and starts the oscillator 30, and the refresh operation is repeated with the predetermined period.

Figure 2:
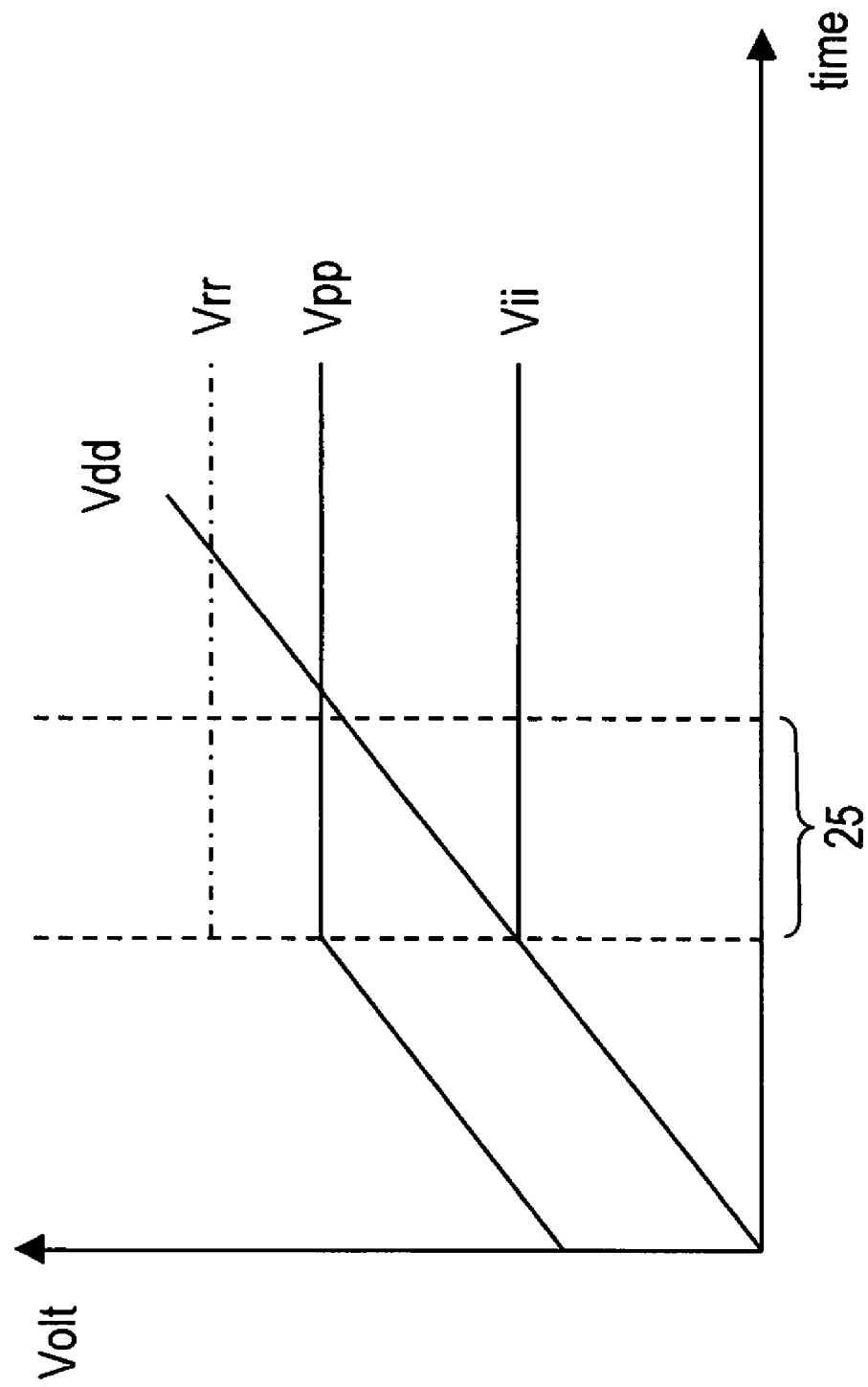
FIG. 2 illustrates the internal power supply in the semiconductor memory device of the present embodiment.

FIG. 2 illustrates the internal power supply in the semiconductor memory device of the present embodiment. In the figure, time is plotted against the abscissa and voltage is plotted against the ordinate. When the power supply is started, the external power supply Vdd rises with time. The first internal power supply generation circuit 22 shown in FIG. 1 boosts the external power supply Vdd and generates the first internal power supply Vpp, and the second internal power supply generation circuit 24 generates the power supply Vii from the external power supply Vdd. A range 25 between the broken lines is a voltage range of the external power supply Vdd that is allowed by a standard, and the potentials of the first and second internal power supply Vpp, Vii have to be constant in this range.

Figure 3A:
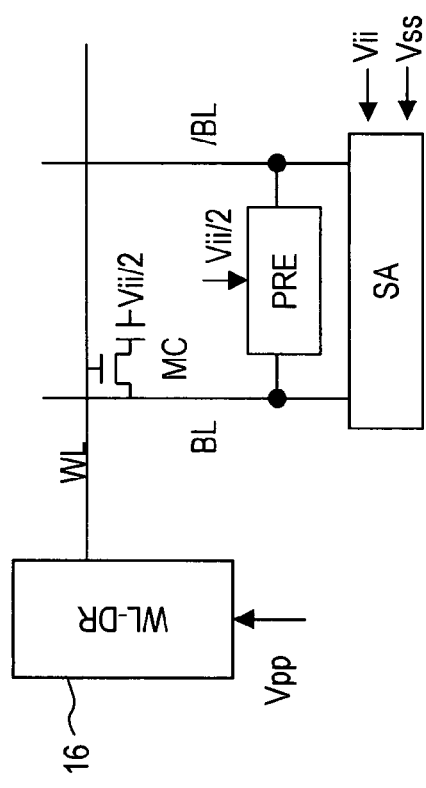
FIG. 3 shows a memory core circuit and an operation waveform thereof.
Figure 3B:
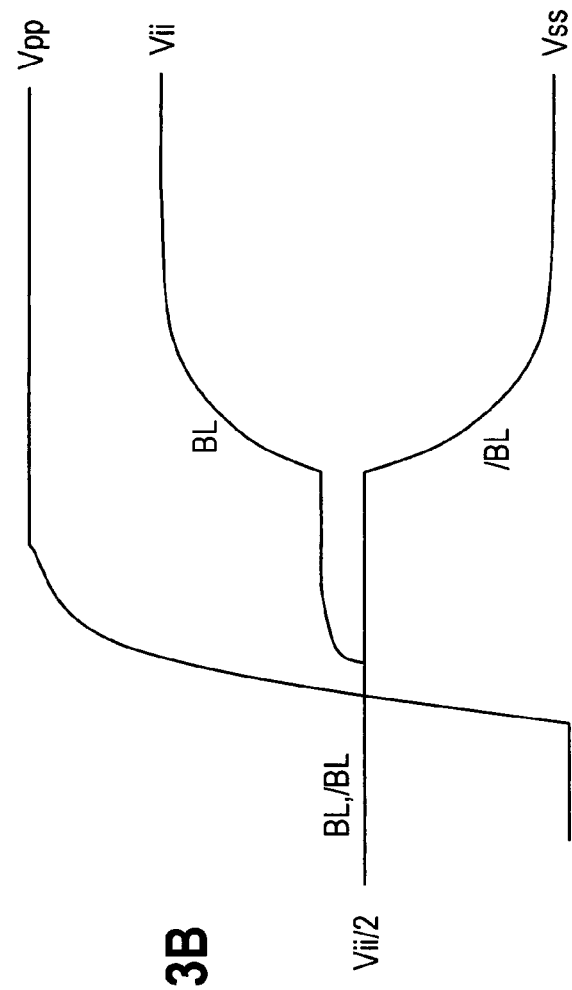

FIG. 3 shows a memory core circuit and the operation waveform thereof. The operation of the memory will be explained with reference to the operation waveform shown in FIG. 3B. First, a pre-charge circuit PRE pre-charges the bit lines BL, /BL to a pre-charge level Vii/2. In such pre-charged state, the word driver 16 drives the word line WL to rise it to the first internal power supply Vpp. As a result, the transistor of the memory cell MC is caused to conduct, and the charge of the capacitor flows out into the bit line BL. This figure shows a state in which a H level is stored in the memory cell MC; the potential of the bit line BL is slightly increased by the conductive state of the memory cell transistor. Accordingly, if the sense amplifier SA is activated, the bit line BL on the H side is driven to the second internal power supply Vii, and the bit line /BL on the reference side is pulled down to a ground potential Vss. Further, by lowering the word line WL again to the ground potential Vss, the H level state of the bit line BL is stored in the capacitor inside the cell MC.

Thus, the word line WL is driven to a high level of the first internal power supply Vpp in order to set the write level on the H side that is written into the capacitor of the memory cell MC to the internal power supply Vii and in order to output sufficiently the written level Vii into the bit line BL during reading. In other words, the first internal power supply Vpp that drives the word line is set higher than the second internal power supply Vii that is the power supply inside the cell.

Returning to FIG. 1, in the present embodiment, the semiconductor memory device has an antifuse memory circuit 40 having a plurality of antifuses. Address information of a defective memory cell for remedy by using a redundant memory cell is written into the antifuse memory circuit 40. In addition, the setting information for finely adjusting the internal power supply level that is generated by the internal power supply generation circuits 22, 24 and the setting information for finely adjusting the impedance of the input/output circuit 20 may also be stored in the antifuse memory circuit 40.

An antifuse basically has a capacitor structure in which two terminals are in an open state, but when a high voltage is applied between the two terminals the dielectric layer of the capacitor is broken down, whereby the two terminal are short circuited. A write voltage Vrr that is applied to short circuit the antifuse is generated by an internal write voltage generation circuit 44. The write voltage Vrr has to have a potential, for example, from several volts to about ten and several volts. Therefore, the antifuse write voltage Vrr generated by the write voltage generation circuit 44 has a potential higher than the first internal power supply Vpp.

Further, in the present embodiment, an external terminal 45 for the application of an external write voltage EVrr is provided in addition to the power supply terminal 21 for the application of the external power supply Vdd, and in a wafer test, the external write voltage EVrr can be applied from the external terminal 45.

In the present embodiment, the antifuse write voltage generation circuit 44 boosts the boosted first internal potential Vpp to generate the antifuse write voltage Vrr that is higher than this first internal power supply Vpp. The first internal power supply Vpp is generated by the first internal power supply generation circuit 22 that boosts the external power supply Vdd. Therefore, because the write voltage generation circuit 44 generates the write voltage Vrr by boosting the first internal power supply Vpp that is higher than the external power supply Vdd, rather than boosting the external power supply Vdd, the number and capacity of boosting capacitors of the incorporated pumping circuit for boosting can be decreased and the circuit scale can be reduced.

Thus, in the present embodiment, the first internal power supply generation circuit 22 generates the first internal voltage Vpp by boosting the external power supply Vdd, and the write voltage generation circuit 44 generates the antifuse write voltage Vrr by boosting the first internal voltage Vpp.

Further, the memory device also has an antifuse memory write control circuit 42 that activates the antifuse write voltage generation circuit 44 and controls the first internal power supply generation circuit 22 to a special operation mode when writing is performed into the antifuse memory. If an antifuse write mode signal AFMe having a predetermined level is applied to an external terminal 41 for writing, the antifuse memory write control circuit 42 is activated. In response, the antifuse memory write control circuit 42 sets the Vpp internal power supply generation circuit 22 to a specific mode, activates energizes the antifuse write voltage generation circuit 44. The first specific mode is a fast mode of the Vpp internal power supply generation circuit 22 that is controlled by a fast mode signal VppA. The second specific mode is a mode in which the internal power supply Vpp is increased above that during usual operation of the memory; this mode is controlled by a high-voltage mode signal VppH. Further, the antifuse memory write control circuit 42 outputs a self-refresh stop signal SRdis that stops the self-refresh operation in order to prevent the word line WL from being driven by such a high internal power supply Vpp and to prevent the memory cell transistor from a breakdown when the Vpp internal power supply generation circuit 22 is set to a specific mode and the internal power supply Vpp becomes higher. As a result, the self-refresh operation is prohibited and the operation of driving the word line WL by a word driver is prohibited.

Further, the antifuse write voltage generation circuit 44 is controlled to start the boosting operation by an antifuse mode signal AFMi from the antifuse memory write control circuit 42. In response to the antifuse mode signal AFMi, the write voltage generation circuit 44 controls the output Vrr to an antifuse read level Vpp, ground level, and high-inductance state.

The write voltage Vrr is applied to the antifuse memory circuit 40 and writing is performed to the antifuse selected in response to a selection signal AFsel. The written data WData are supplied to a column selection circuit 20 and used for switching information relating to a redundant memory cell. Alternatively, the written data can be also used as setting information for potential level adjustment of the internal power supply generation circuits 22, 24 or setting information for a potential level adjustment of the write voltage generation circuit 44 (such configurations are not shown in the figure).

Figure 4:
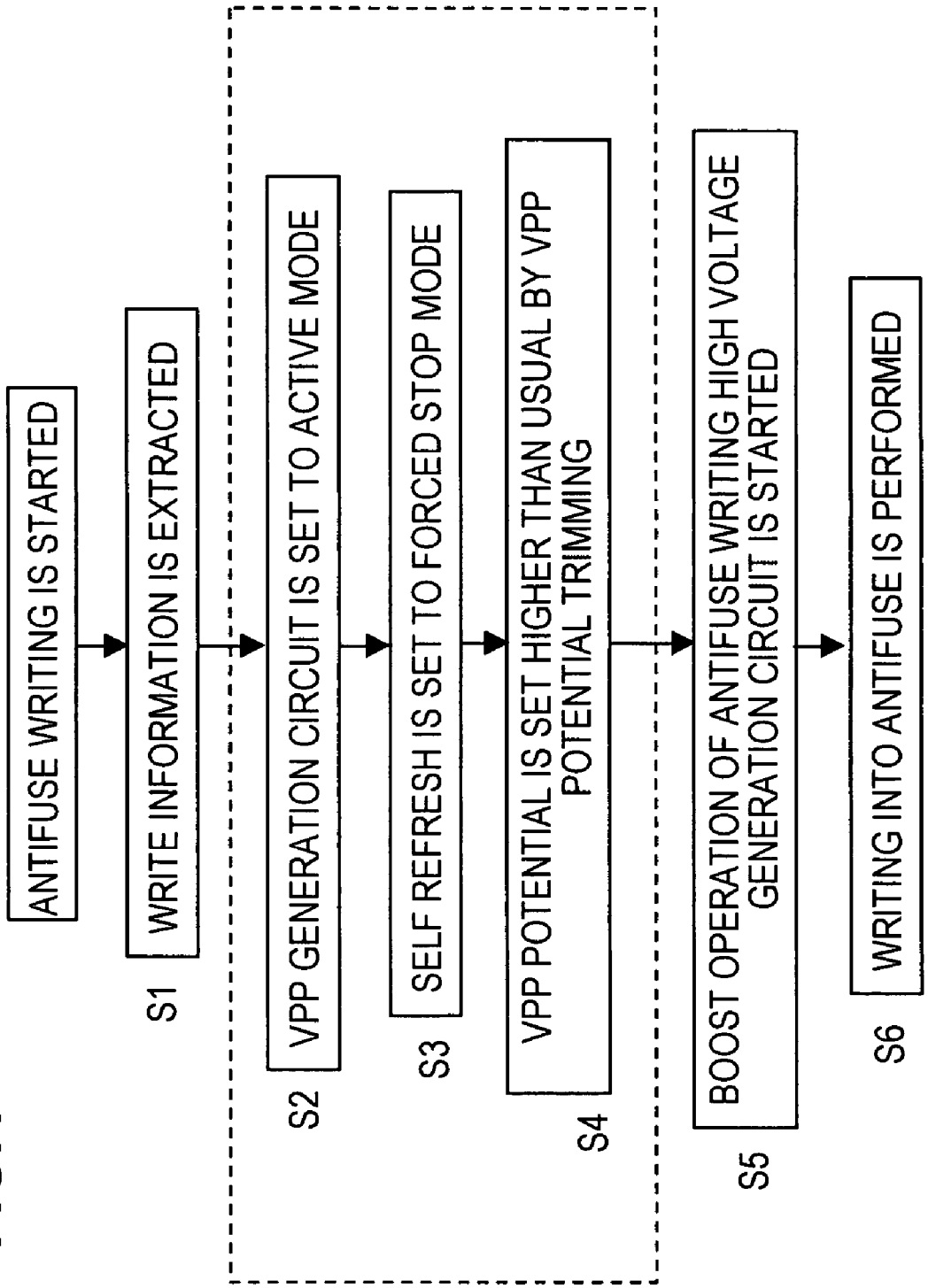
FIG. 4 is an operation flowchart of the antifuse memory write control circuit in the present embodiment.

FIG. 4 is a flowchart diagram illustrating the operation of the antifuse memory write control circuit in the present embodiment. If the external antifuse mode signal AFMe is applied to the external terminal 41, the antifuse memory write control circuit 42 initiates the antifuse write operation. First, the write information that will be written into the antifuse memory is extracted from an external test device (S1). Then, the steps S2, S3, S4 enclosed in a broken line box are executed before a boosting operation of the write voltage generation circuit 44 is initiated (S5).

First, the write control circuit 42 supplies an active mode signal VppA to the Vpp internal power supply generation circuit 22 and controls the Vpp internal power supply Vpp generation circuit 22 to an active mode, that is, to a fast mode. The Vpp internal power supply generation circuit 22 is controlled to an active mode and operates in a mode with a fast response characteristic when the memory is in an active state. The mode with a fast response characteristic is a mode in which if the boost internal power supply Vpp decreases following the operation of the memory core, the circuit rapidly responds to such decrease and performs a boosting operation of the internal power supply Vpp, thereby preventing it from dropping. Conversely, when the power supply Vpp rises following the boosting operation, the circuit rapidly responds to this increase and stops the boosting operation of the power supply Vpp, thereby preventing this power supply from increasing above the necessary level. On the other hand, when the memory is in a standby mode, the Vpp internal power supply generation circuit 22 is controlled to a non-active mode and operates in a mode with a slow response characteristic. As a result power consumption can be decreased.

Further, because the antifuse write operation is performed in the test stage, the memory is in a standby state. However, because the write voltage Vrr is generated from the boost internal power supply Vpp, the Vpp internal power supply generation circuit 22 is controlled to an active mode, that is, to a fast mode in which the response operation is performed at a high speed during the antifuse writing, in order to maintain the write voltage Vrr at a sufficient level and prevent the occurrence of defects in writing.

Then, the antifuse write control circuit 42 outputs the self-refresh stop signal SRdis and forcibly sets the self-refresh operation to a stop mode (S3). In other words, the external power supply Vdd is activated during antifuse writing, but if the external power supply Vdd is started in the memory device, a self-refresh enable signal SRen automatically assumes an enable state. At the same time, the oscillator 30 starts oscillating, a trigger signal is outputted for each constant period, and the self-refresh control circuit 28 executes a self-refresh operation.

Accordingly, in the present embodiment the write control circuit 42 forcibly set to a stop mode so that such self-refresh operation is not performed. The stop signal may be also applied to the self-refresh control circuit 28.

Further, the write control circuit 42 sets the Vpp level of the Vpp internal power supply generation circuit 22 higher than usual with the high-voltage mode signal VppH (S4). The Vpp level of the Vpp internal power supply generation circuit 22 is finely adjusted and increased above the usual level according to the high-voltage mode signal VppH. By increasing the Vpp level, the width of the boosted voltage generated by the write voltage generation circuit 44 can be reduced and the circuit scale can be reduced or the time for boosting can be shortened. The internal power supply Vpp is supplied to the memory core 10 and used for the drive power supply for the word line WL. Therefore, a high voltage of the internal power supply Vpp is applied to the gate electrode of the memory cell transistor. However, because the self-refresh operation stops, the word line is not driven inside the memory core and the effect of the increased Vpp level on the memory core can be eliminated.

Finally, the write control circuit 42 controls the start of the boosting operation of the write voltage generation circuit 44 by the antifuse mode signal AFMi (S5). As a result, the write voltage generation circuit 44 boosts the boost internal power supply Vpp higher and generates the write voltage Vrr. Writing to the antifuse memory 40 is then executed (S6). The writing is performed into the antifuse that was selected in the antifuse memory 40 by applying the boosted write voltage Vrr. This write operation includes writing with the write voltage Vrr and reading that checks the written data.

As describe above, because the Vpp internal power supply generation circuit 22 has been set to a fast response mode, the Vpp is maintained at a stable level. Furthermore, because the Vpp has been set to a level higher than usual, the boosting operation of the write voltage generation circuit 44 is facilitated. Further, even if the Vpp level is set higher than usual, because the self-refresh operation is stopped before such setting is made, the cell transistors are prevented from a breakdown by the high Vpp via the word line.

The antifuse write voltage generation circuit 44, antifuse memory circuit 40, and Vpp internal power supply generation circuit 22 will be described below in greater detail.

Figure 5:
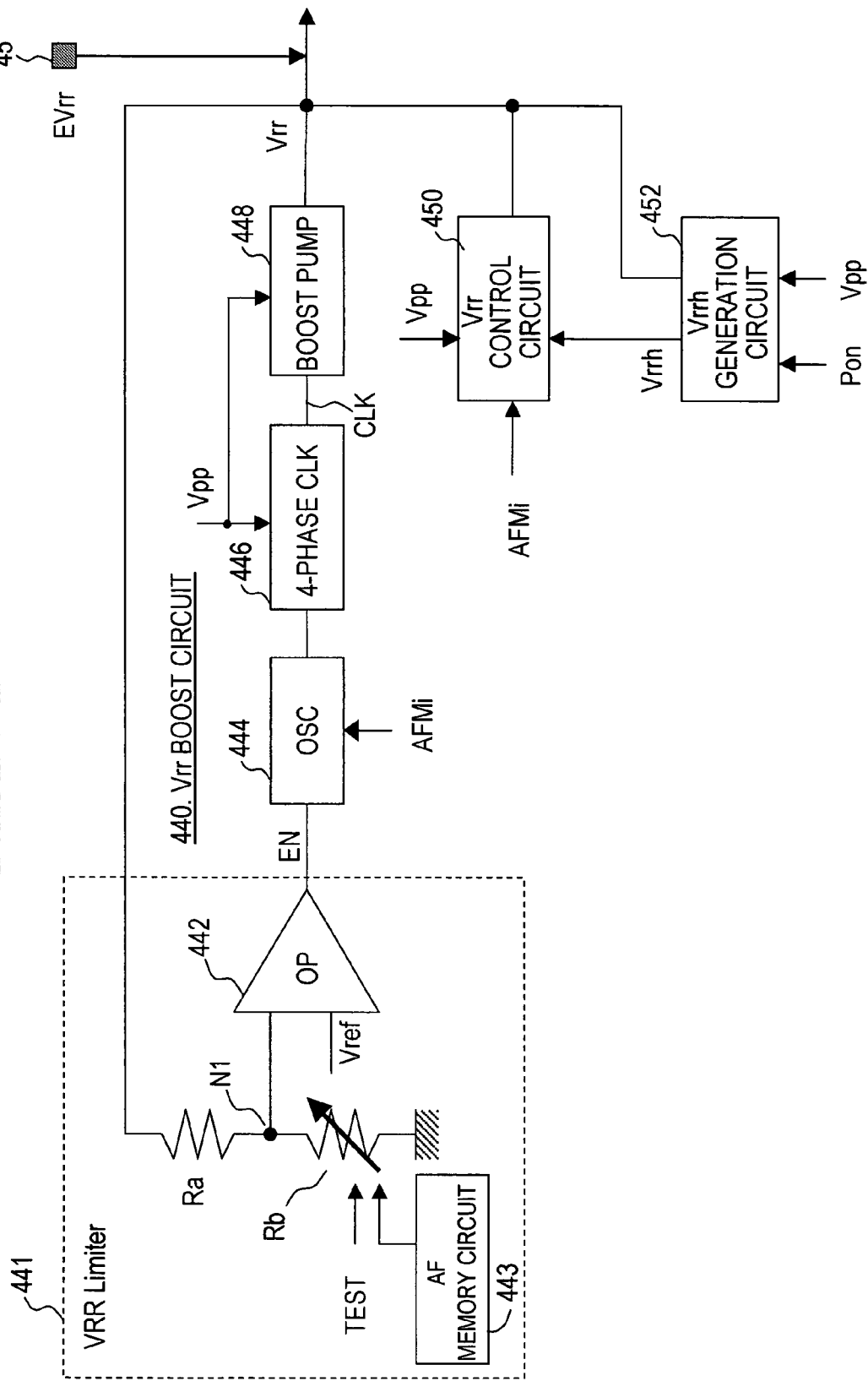
FIG. 5 is a structural drawing of the antifuse write voltage generation circuit.
Figure 8:
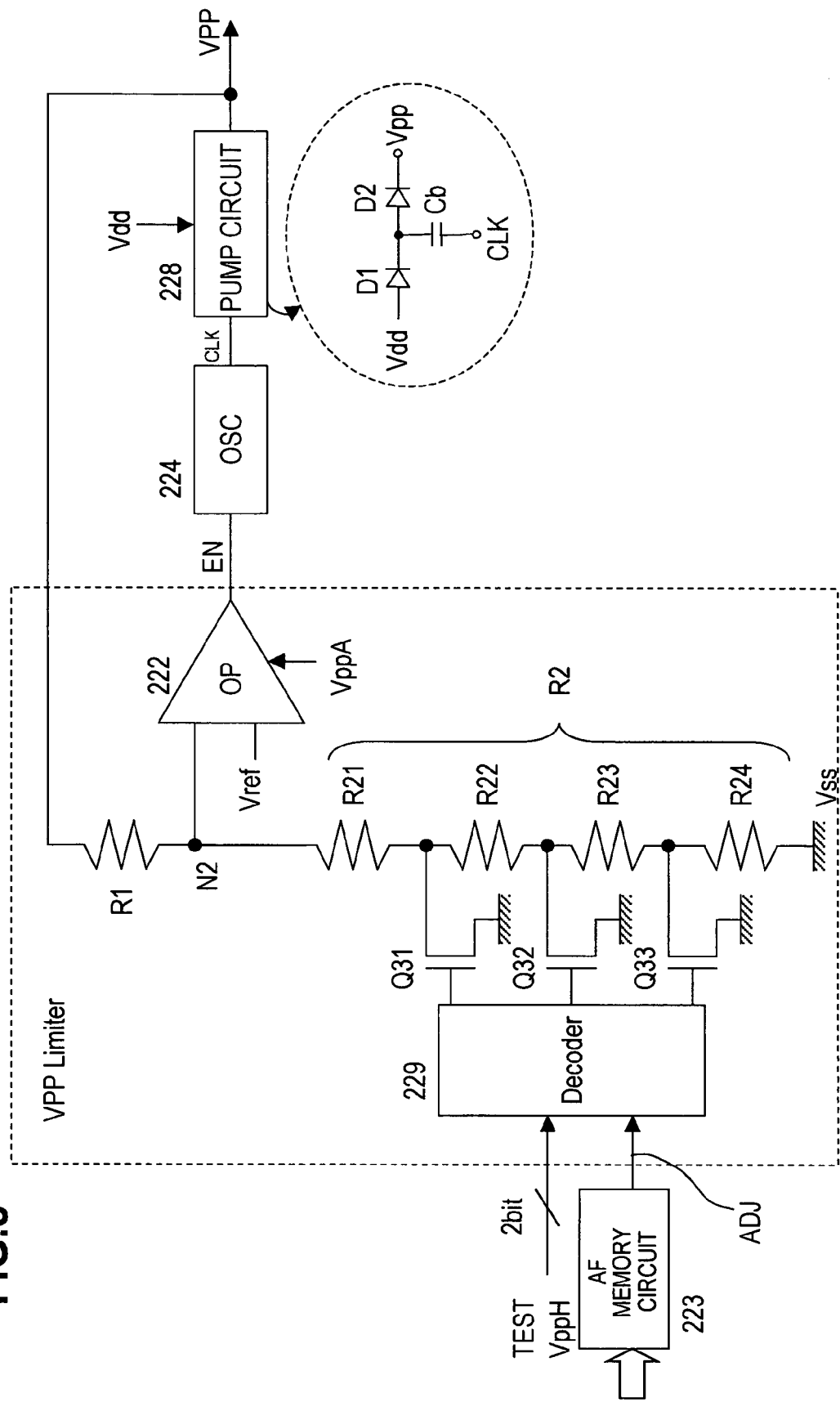
FIG. 8 is a circuit diagram of the first internal power supply generation circuit.

FIG. 5 is a structural drawing of the antifuse write voltage generation circuit. The antifuse write voltage generation circuit 44 has a Vrr boosting circuit 440, a Vrr voltage control circuit 450, and a Vrrh generation circuit 452. The Vrr boosting circuit 440 has a limiter circuit 441 composed of an operational amplifier 442, a feedback resistor Ra, and an adjustable resistor Rb, an oscillation circuit 444 that oscillates in response to an enable signal EN from the operational amplifier 442, a four-phase clock generation circuit 446 that generates a four-phase clock from a clock generated by the oscillation circuit 444 and converts the level of the clock from the level of the power supply Vdd to the level of the boost power supply Vpp, and a boosting pump circuit 448 which is boosted by the four-phase clock CLK. The boost internal power supply Vpp is supplied to the boosting pump circuit 448, and the boosting operation is performed by the four-phase clock CLK of the Vpp level up to the antifuse write voltage level. The boosting pump circuit 448, as shown in the below-described FIG. 8, is a usual pump circuit composed of diodes and capacitors. However, because boosting is performed from the boost internal power supply Vpp, the number or capacity of the capacitors can be decreased and the circuit scale can be reduced.

In the limiter circuit 441, the boosted write voltage Vrr is returned by feedback via the resistor Ra, and the level of a node N1 in which the write voltage Vrr is divided by the resistors Ra and Rb is inputted into the operational amplifier 442. A predetermined reference voltage Vref is inputted into one more input of the operational amplifier 442. The potential of the node N1 is controlled by the operation of the operational amplifier 442 so as to be matched with the reference voltage Vref. In other words, if the potential of the node N1 becomes less than the reference voltage Vref, the enable signal EN assumes a H level and the oscillation operation of the oscillation circuit 44 is started. As a result, the boosting operation of the boosting pump circuit 448 is started. If the write voltage Vrr accordingly rises, the potential of the node N1 also rises, and if this potential exceeds the reference voltage Vref, the enable signal EN assumes a L level and the oscillation operation of the oscillation circuit 44 stops.

The adjustable resistor Rb is adjusted to the desired value by the adjustment signal TEST during the test, the level of the write voltage Vrr generated thereby is monitored, and the adjustment signal that assumes an optimum level is written into the antifuse memory circuit 443. Once adjustment ends, the resistance value of the resistor Rb is set by the adjustment signal from the antifuse memory circuit 443.

In the write voltage generation circuit 44, the Vrr boosting circuit 440 makes the output voltage Vrr to the increased write voltage level, and the Vrr control circuit 450, firstly, controls the output voltage Vrr to voltage Vpp for reading the antifuse memory, secondly, controls the output voltage Vrr to a ground in a period other than the antifuse writing interval, and, thirdly, controls the terminal of the output voltage Vrr to a high impedance so as to output an external antifuse write voltage EVrr applied from the external terminal 45 during the wafer test. The Vrr control circuit 450 performs the above-described control according to the state of the antifuse write mode signal AFMi.

Further, the Vrrh generation circuit 450 divides the voltage between write voltage Vrr and boost internal power supply Vpp by resisters to generate a medium voltage Vrrh thereof. In the period in which the write voltage Vrr has not yet been boosted, the Vrrh generation circuit 450 outputs the boost internal power supply Vpp as the medium voltage Vrrh in response to a signal Pon at the time the power is turned on.

Figure 6:
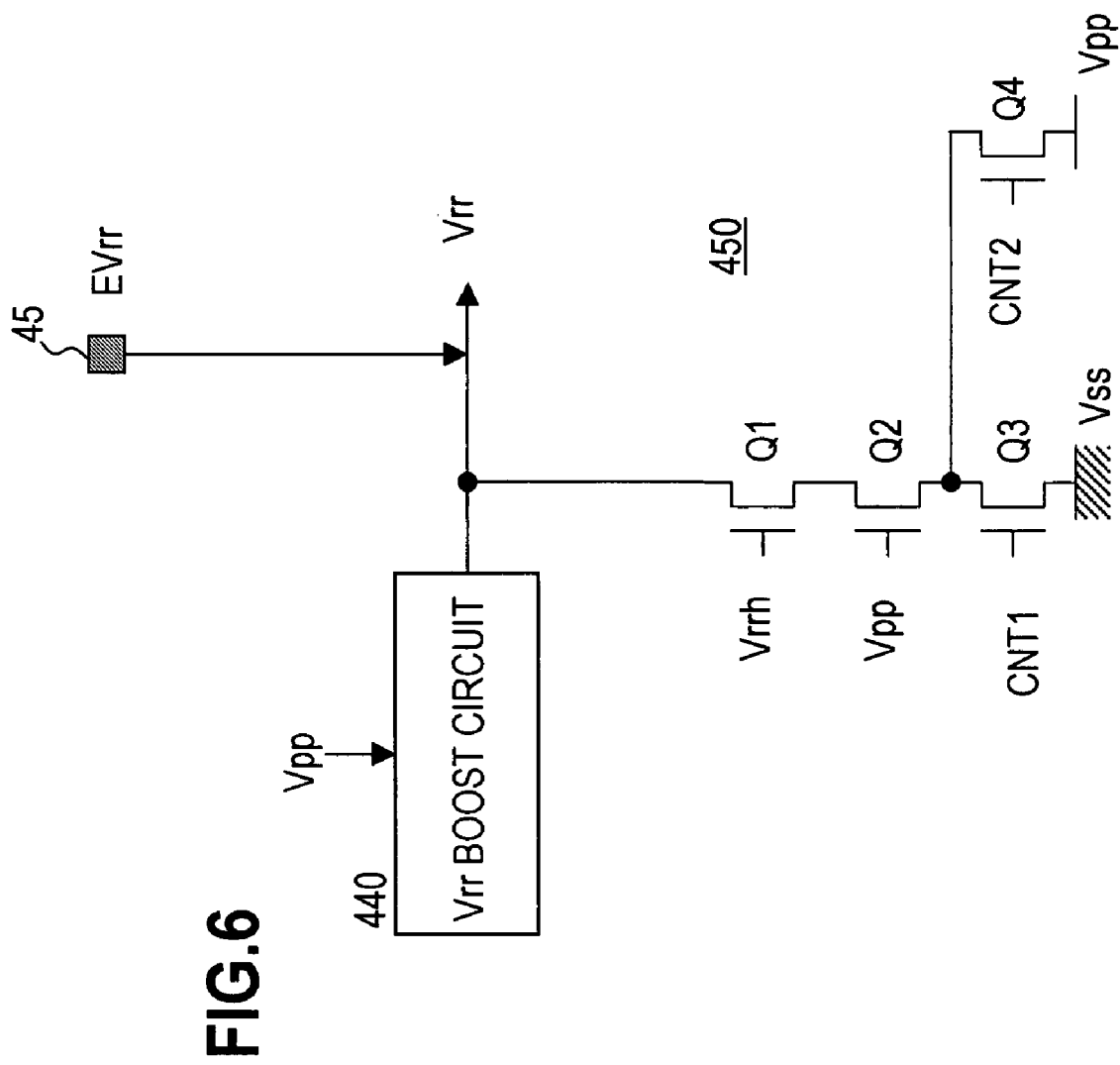
FIG. 6 is a circuit diagram of the Vrr control circuit.

FIG. 6 shows a circuit diagram of the Vrr control circuit. The Vrr control circuit 450 sets the output terminal Vrr of the Vrr boosting circuit 440 (1) to the boosted write voltage during antifuse writing, (2) to a voltage Vpp-Vth during antifuse reading (confirmation of write), (3) to a high impedance at the time of application of the external write voltage EVrr from the eternal terminal 45 during the wafer test, and (4) to a ground potential during normal operation of the memory.

The circuit composed of transistors Q1, Q2, Q3 generates the above-described (4) state. The Vrrh (Vpp<Vrrh<Vrr) voltage is applied to the gate of the transistor Q1, the Vpp voltage is applied to the gate of the transistor Q2, and the control signal CNT1 generated from the antifuse mode signal AFMi is applied to the gate of the transistor Q3. When the control signal CNT1 is at a L level and the transistor Q3 is OFF, if a high voltage Vrr is directly applied to the transistor Q3, it sometime cause the breakdown of the transistor Q3. Therefore, the voltage Vrr is divided by the transistors Q1, Q2. If the control signal CNT1 assumes a H level, the transistor Q3 is switched ON and the output terminal Vrr is pulled down to the ground potential Vss.

The circuit of transistor Q4 generates the above-described (2) state. A control signal CNT2 is generated from the antifuse mode signal AFMi and when it assumes a H level, the transistor Q4 is switched ON and the output terminal Vrr is set to the Vpp-Vth voltage. As a result, the reading of the written antifuse is performed and the write-in is confirmed.

When the transistors Q3, Q4 are in the OFF state, the Vrr boosting circuit 440 performs a boosting operation, whereby boosted voltage is generated at the output terminal Vrr (the above-described (1) state), and if the Vrr boosting circuit 440 stops, the output terminal Vrr assumes a high-impedance state (the above-described (3) state).

Figure 7:
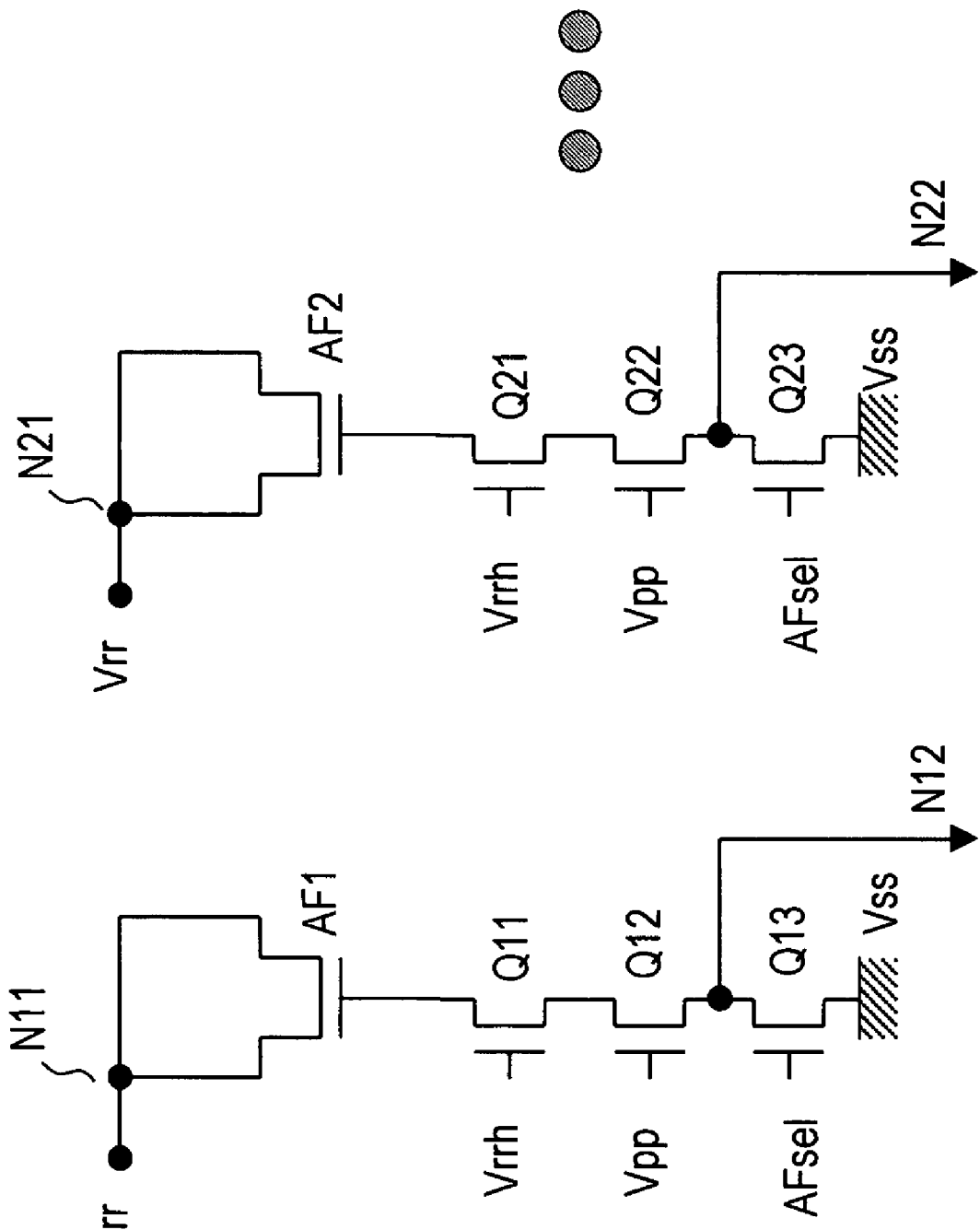
FIG. 7 is a circuit diagram of the antifuse memory circuit.

FIG. 7 is a circuit drawing of the antifuse memory circuit. Two-bit antifuses AF1, AF2 are shown in FIG. 7. The antifuse AF1 is composed of a first terminal N11 connecting the source and drain terminals of the MOS transistor and a second terminal of the gate. The output terminal Vrr of the write voltage generation circuit 44 is connected to the first terminal N11. Further, transistors Q11, Q12, Q13 are connected in series between the ground Vss and the gate electrode of the antifuse AF1. The Vrrh voltage is applied to the gate of the transistor Q11, the Vpp voltage is applied to the gate of the transistor Q12, and the selection signal AFsel is applied to the gate of the transistor Q13.

Explaining the antifuse AF1 by way of an example, if the write voltage Vrr is applied to the terminal N11 and the selection signal AFsel assumes a H level so that the transistor Q13 is switched ON during writing, the write voltage Vrr is applied between the gate and source-drain of the antifuse AF1, and the gate oxide film of the antifuse is broken. The transistors Q11, Q12 have a voltage division function such that a high voltage Vrr is not applied directly to the transistor Q13 due to the coupling action produced by the antifuse AF1 having a capacitor structure, when the selection signal AFsel is at a L level and the transistor Q13 is OFF. In other words, when the transistor Q13 is OFF, a Vrr-Vrrh voltage is applied between the gate and drain of the transistor Q11, a Vrrh-Vth-Vpp voltage is applied between the gate and drain of the transistor Q12, and a Vpp-Vth-Vss voltage is applied between the gate and drain of the transistor Q13. Therefore, a high voltage is not applied to those transistors.

In the read mode, the voltage Vpp of the read mode is applied to the terminal N11, and the voltage of the node N12 is checked. If writing has ended, the node N12 assumes a high voltage level, and if writing has not ended, the node N12 assumes a low voltage level.

The antifuse AF2 performs identical operations, but the selection signal AFsel is different from that of the antifuse AF1. This selection signal AFsel is a data signal corresponding to the write information (S1) of FIG. 4.

Figure 9:
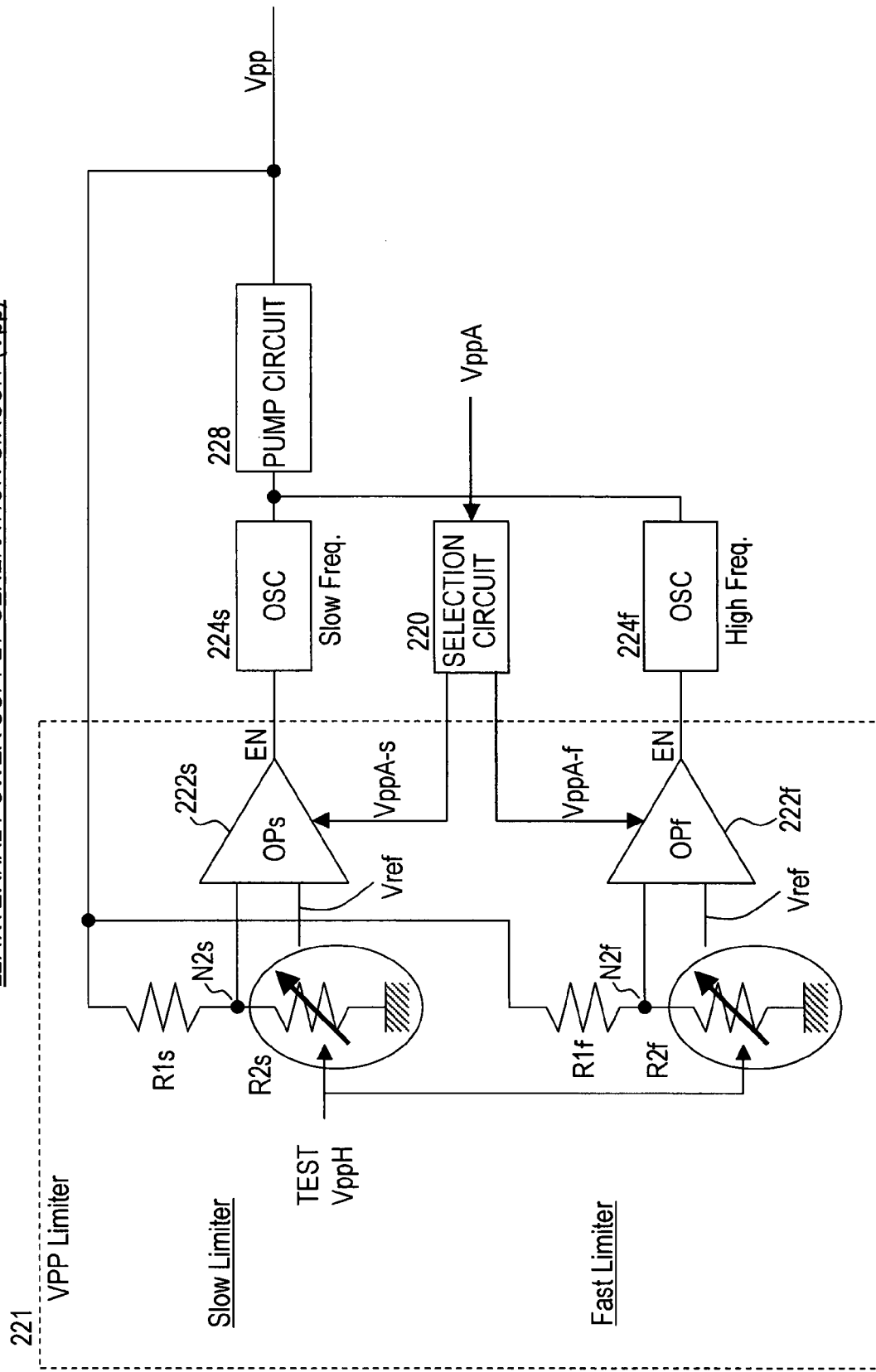
FIG. 9 is a circuit diagram of the first internal power supply generation circuit.

FIG. 8 and FIG. 9 are circuit drawings of the first internal power supply generation circuit. FIG. 8 is a schematic drawing and FIG. 9 is a circuit drawing illustrating the fast and slow modes. The Vpp internal power supply generation circuit 22 shown in FIG. 8 is composed of a limiter circuit 221, an oscillator 224 operated and controlled by the output of an operational amplifier 222 located in the limiter circuit, and a pump circuit 228 performing a boosting operation in response to an output clock CLK of the oscillator. The operational amplifier 222 is controlled to a fast mode or slow mode by the fast mode signal VppA. Further, the resistor R2 located in the limiter circuit 221 is adjusted to a low resistance value by the high-voltage mode signal VppH, and the boost voltage Vpp is set to a high level.

Similarly to the write voltage generation circuit of FIG. 5, the boost voltage Vpp of the pump circuit 228 is returned by feedback to the limiter circuit 221, the boost voltage Vpp is divided by the resistors R1, R2, and the voltage of the node N2 is applied to one input terminal of the operational amplifier 222. A reference voltage Vref is applied to another input terminal of the operational amplifier 222. The resistor R2 is composed of a plurality of resistors R21 to R24 and can be set variably by selection with the transistors Q31 to Q33. Further, one of the transistors Q31 to Q33 is switched ON by the decoding results of the two-bit setting signal applied to the decoder 229 and the resistance value of the resistor R2 is set.

The input node N2 of the operational amplifier 222 operates so as to match the reference voltage Vref. If the boost voltage Vpp rises, the enable signal EN of the operation amplifier output assumes a disabled state (L level), the oscillator 224 is stopped, and the boost operation is stopped. If the boost voltage Vpp is used in the memory core and decreases, the enable signal EN of the operational amplifier output again assumes the enable state (H level), the oscillator 224 is actuated, and the boost operation starts again. Therefore, the boost voltage Vpp fluctuates above and below the reference level.

If the resistance value of the variably settable resistor R2 is set low, the voltage division level of the node N2 decreases. Therefore, control is performed so that the boost voltage Vpp rises. On the other hand, if the resistance value of the resistor R2 is set high, the voltage division level of the node N2 rises. Therefore, control is performed so that the boost voltage Vpp drops.

Three types of setting signals are applied to the decoder 229. The first signal is an adjustment signal TEST applied during the test, the second signals is an adjustment signal ADJ from the antifuse memory circuit 223, and the third signal is a high-voltage mode signal VppH applied during antifuse writing. In the test process, a state is detected by the first adjustment signal TEST in which the generated boost voltage Vpp assumes a desired value, and the adjustment signal ADJ is stored in the memory circuit 223. Then, in the usual operation, the resistance value of the resistor R2 is set by the adjustment signal ADJ. On the other hand, during antifuse writing, the resistor R2 is set lower than usual by the high-voltage mode signal VppH, and the boost voltage Vpp is set higher than usual.

The configurations of the decoder 229, transistors Q31-A33, and resistors R2 (R21-R24) are also the same in the write voltage generation circuit shown in FIG. 5.

A circuit configured of two diodes D1, D2 and capacitor Cb, as shown in FIG. 8, is a basic configuration for the pump circuit 228, and the level of the external power supply Vdd is boosted by the output clock CLK of the oscillator 224. The configuration of this pump circuit can be also applied to the pump circuit of the write voltage generation circuit of FIG. 5. However, the power supply serving as a boosting source is the boosted first internal power supply Vpp in case of FIG. 5, rather than the external power supply Vdd.

FIG. 9 shows a configuration corresponding to a fast mode (active mode) and slow mode (non-active mode) of the internal power supply generation circuit 22. A limiter circuit 221 is composed of a limiter circuit 222s, R1s, R2s for the slow mode and the limiter circuit 222f, R1f, R2f for the fast mode, and the oscillator is also composed of an oscillator 224s for the slow mode and an oscillator 224f for the fast mode. Based on the fast mode signal VppA, the selection circuit 220 activates one of the operational amplifiers 222s, 222f, thereby switching to the slow mode or fast mode. The adjustable resistors R2s, R2f are shown in FIG. 8.

The limiter circuit for the slow mode is so configured that the resistor R1s is set high, the response to the change in the boost voltage Vpp is slow, and the operation speed of the operational amplifier 222s is also slow, as described hereinbelow. Conversely, the limiter circuit for the fast mode is so configured that the resistor R1f is set low, the response to the change in the boost voltage Vpp is fast, and the operation speed of the operational amplifier 222f is also high. If the fast mode signal VppA is in the fast mode (active mode), the operational amplifier 222f operates, but the operational amplifier 222s stops. Conversely, if the fast mode signal VppA is in a slow mode (non-active mode), the operational amplifier 222s operates, but the operational amplifier 222f stops.

Further, the oscillator 224s of the slow side generates a low-frequency clock, and the oscillator 224f of the fast side generates a high-frequency clock.

Figure 10:
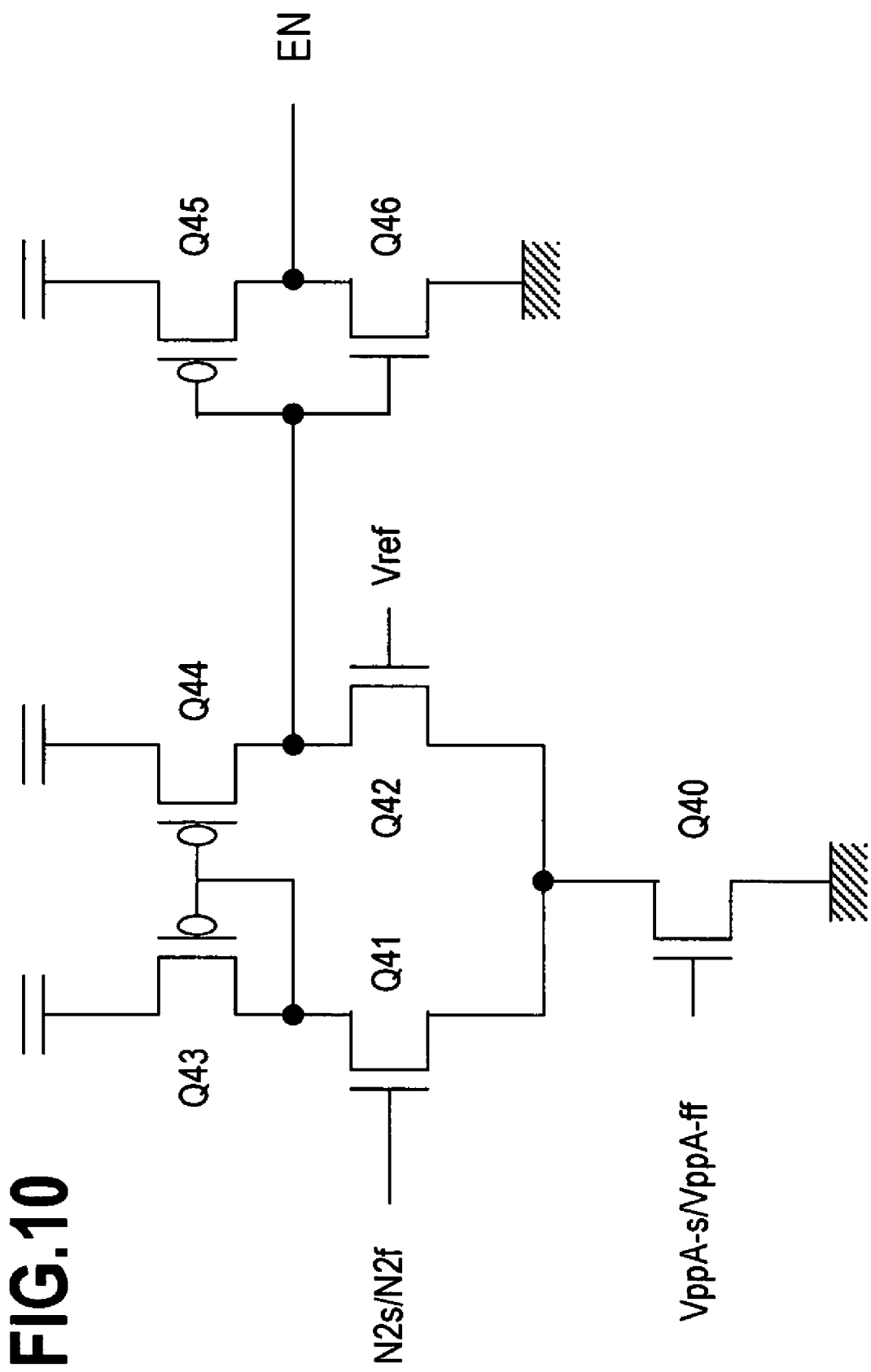
FIG. 10 illustrates the waveform of the rising voltage Vpp of the internal power supply generation circuit 22.

FIG. 10 is a circuit drawing of an operational amplifier. The operational amplifiers 222s, 222f have a N channel transistor Q40 of a current source, N channel transistors Q41, Q42 to which nodes N2s, N2f, which are detection voltages, and reference voltage Vref are applied, P channel transistors Q43, Q44 constituting a mirror circuit, and transistors Q45, Q56 constituting an output inverter. If the detection voltages N2s, N2f are less than the reference voltage Vref, the output EN assumes a H level (enable). Conversely, if the detection voltages are higher than the reference voltage Vref, the output EN assumes a L level (disable).

The current source transistor Q40 has a high current value in the operational amplifier on the fast side and a low current value in the operational amplifier on the slow side. The operational amplifier on the fast side operates at a higher speed. Selection signals VppA-s, VppA-f generated by the fast mode signal VppA are supplied to the gate of the current source transistor Q40, the operational amplifier with a conductive current source assumes an operation state, and the operational amplifier with a non-conductive current source assumes a standby state. In the standby state, the output EN assumes a L level and the oscillator that is the destination thereof stops.

FIG. 11 shows a waveform of the boost voltage Vpp of the internal power supply generation circuit 22. FIG. 11A illustrates the mode with a low response speed and FIG. 11B illustrates the mode with a high response speed. In the slow mode shown in FIG. 11A, the response rate of the limiter circuit is low and the oscillator frequency is also low. Therefore, when the boost voltage Vpp decreases greatly with respect to the reference value VR, the voltage increasing operation then starts, where as when the boost voltage greatly exceeds the reference value, the voltage increasing operation then stops, and the gradient of increase during such voltage increase is small. As a result, the boost voltage Vpp fluctuates greatly up and down with respect to the reference value VR as a center.

On the other hand, in the fast mode shown in FIG. 11B, the response speed of the limiter circuit is high and the frequency of the oscillator is also high. Therefore, if the boost voltage Vpp becomes slightly lower than the reference value VR, the boosting operation is immediately started, and as soon as the boost voltage slightly exceeds the reference voltage, the boosting operation is immediately stopped; the gradient of increase during such boosting is large. As a result, the boost voltage Vpp fluctuates slightly up and down with respect to the reference value VR as a center. Thus, in the fast mode, because the level of the boost voltage Vpp is maintained close to the reference value VR, the write voltage Vrr generated from the voltage Vpp is also maintained close to the standard value and write defects caused by voltage decrease are avoided.

FIG. 12 is a structural drawing illustrating how the refresh operation is prohibited in the present embodiment. This figure shows the oscillator 30 started by the self-refresh energizing signal SRen, a self-refresh control circuit 28 executing the serf-refresh operation by using the clock generated by the oscillator as a trigger signal, and the memory core control circuit 26; these three components were shown in FIG. 1. By contrast with the configuration of FIG. 1, in the example shown in FIG. 12, a control signal from the self-refresh control circuit 28 is stopped by the AND gate 33 in response to the self-refresh stop signal SRdis from the antifuse memory write control circuit 42, and the self-refresh operation in the memory core 10 is prohibited.

FIG. 13 is a flowchart showing the relationship between the wafer test and package test in the present embodiment. The operation test in a state of an assembled package has recently become important, in addition to the operation test at the wafer stage. In particular, a multichip package (MCP) in which two identical chips are stacked and accommodated and the terminals of both chips are connected to the external terminals of the package, and a system-in package (SiP) in which different chips are stacked and the terminals of one chip are connected to the other chip and not connected to the external terminal of the package have been suggested. In such devices, a plurality of chips have to be mounted in the assembly process, the assembling cost is high and the unit cost of the packaged final product is high. Therefore, a remedy measure is required against the defects detected in the package test after the assembling.

In the case of the antifuse memory of the present embodiment, it is possible to generate the write voltage Vrr inside and perform writing into the antifuse memory even after packaging. Therefore, the antifuse memory can be usefully installed on the above-described devices that have a high additional value.

If a defect is detected by the wafer test S21 in the test process shown in FIG. 13, the external write voltage EVrr is applied from the external terminal 45 and the defect address information is written into the antifuse memory, without using the incorporated antifuse memory write control circuit 42 or write voltage generation circuit 44 (S22). Further, the remedied good chip is assembled as the aforementioned MCP or SiP package (S23). Single bit defects or the like sometimes occur inside a memory cell array due to stress application in the assembly process. Accordingly, the operation test is performed in the package test S24 to detect the defect (S25), and if the defect is detected, an antifuse write mode signal AFMe is applied from the external terminal 41 and the defect address is written into the antifuse memory (S26). At this time, writing into the antifuse is performed by the write voltage Vrr generated by the incorporated write voltage generation circuit 44 and the defect is remedied. The remedied package is shipped as a good product (S27).

As described hereinabove, with the present embodiment, the write voltage generation circuit for writing into the antifuse memory boosts the boost voltage Vpp used in the memory core to generate the write voltage Vrr. Therefore, the circuit scale can be reduced by comparison with the case where boosting is performed from the external power supply Vdd. Moreover, in the write mode, by setting the response speed of the internal power supply generation circuit 22 that generates the boost voltage Vpp to a fast mode (active mode) so as to stabilize the boost voltage Vpp, and by setting the boost voltage Vpp higher than usual in a state with a stopped self-refresh operation, the scale of the write voltage generation circuit can be further reduced and time to the voltage increased level can be shortened.

I claim:

1. A semiconductor memory device to which an external power supply voltage is applied, comprising:
   a first internal power supply generation circuit that boosts the external power supply voltage to generate a first internal power supply;
   a memory core to which the first internal power supply is supplied;
   an antifuse memory in which predetermined information is written; and
   a write voltage generation circuit that boosts the first internal power supply to generate an antifuse write voltage,
   wherein writing to an antifuse of the antifuse memory is performed by applying the antifuse write voltage thereto,
   wherein the first internal power supply generation circuit boosts the first internal power supply to a first potential when the memory is in an active state, and
   wherein the semiconductor memory device includes an antifuse write control circuit for controlling the first internal power supply generation circuit so that the first internal power supply boosts to a second potential that is higher than the first potential during antifuse writing.

2. The semiconductor memory device according to claim 1, wherein the first internal power supply generation circuit operates in a slow mode where a response speed for generating the first internal power supply is decreased when the memory is in a standby state, and operates in a fast mode where the response speed is increased when the memory is in an active state.

3. The semiconductor memory device according to claim 2, wherein the first internal power supply is used for a word line drive power supply in the memory core, and the semiconductor memory device further comprising a self-refresh control circuit that successively executes a refresh operation of memory cells at a predetermined period when power is turned on; and
   wherein the antifuse write control circuit performs control so as to prohibit the refresh operation of the self-refresh control circuit during antifuse writing.

4. The semiconductor memory device according to claim 1, further comprising
   a high-voltage external terminal to which an external antifuse write voltage that is higher than the first internal power supply level is applied,
   wherein in a wafer test, an output of the write voltage generation circuit is set to a high-impedance state, the external antifuse write voltage is applied from the high-voltage external terminal to perform writing-in the antifuse memory, and in a package test after assembling, an antifuse write high voltage generated by the write voltage generation circuit is applied to perform writing in the antifuse memory.

5. The semiconductor memory device according to claim 1, further comprising:
   a second internal power supply generation circuit that generates a second internal power supply having a constant level from the external power supply voltage, the second internal power supply being supplied to the memory core; and
   the first internal power supply has a level higher than the second internal power supply.

6. The semiconductor memory device according to claim 2, wherein the first internal power supply generation circuit has an oscillator, a pump circuit that boosts the first internal power supply to the antifuse write voltage by a clock generated by the oscillator, and a limiter circuit that monitors a potential of the first internal power supply, sets the oscillator to an operation state if the monitored potential becomes lower than a predetermined reference value and sets the oscillator to a disabled state when the monitored potential exceeds the reference value, wherein in the slow mode, the response speed of the limiter circuit is decreased, and in the fast mode, the response speed of the limiter circuit is increased faster than the slow mode.

7. The semiconductor memory device according to claim 2, wherein the first internal power supply generation circuit has an oscillator, a pump circuit that boosts the first internal power supply to the antifuse write voltage by a clock generated by the oscillator, and a limiter circuit that monitors a potential of the first internal power supply, sets the oscillator to an operation state if the monitored potential becomes lower than the predetermined reference value and sets the oscillator to a disabled state when the monitored potential exceeds the reference value, wherein the effective level of the predetermined reference value of the limiter circuit is set to be higher when the memory is in the antifuse writing state than when the memory in the active state.

8. The semiconductor memory device according to claim 1, wherein the antifuse of the antifuse memory is composed of a first terminal that short circuits the source and drain of a MOS transistor and a second terminal of the gate, and the writing is performed by applying the write voltage between the first and second terminals.

9. The semiconductor memory device according to claim 8, wherein after the antifuse writing, the first internal power supply voltage is applied between the first and second terminal and the written state is read out.

10. A semiconductor memory device to which an external power supply voltage is applied, comprising
    a first internal power supply generation circuit that boosts the external power supply voltage to generate a first internal power supply;
    a second internal power supply generation circuit that generates a second internal power supply that is lower than the first internal power supply from the external power supply voltage;
    a memory core having a memory array in which a word line is driven by the first internal power supply and the second internal power supply is connected to a capacitor of a memory cell;
    an antifuse memory in which defective bit remedy information located in the memory array is written; and
    a write voltage generation circuit that boosts the first internal power supply to generate an antifuse write voltage,
    wherein the antifuse write voltage is applied to an antifuse of the antifuse memory to perform writing thereto,
    wherein the first internal power supply generation circuit boosts the first internal power supply to a first potential when the memory is in an active state, and
    wherein the semiconductor memory device includes an antifuse write control circuit for controlling the first internal power supply generation circuit so that the first internal power supply boosts to a second potential that is higher than the first potential during antifuse writing.

11. The semiconductor memory device according to claim 10, further comprising
    an antifuse write control circuit that starts the write voltage generation circuit in response to an antifuse write mode signal; and
    in a wafer test, the antifuse writing is performed by using an external write voltage supplied from an external terminal, and in a package test, the antifuse write control circuit starts the write voltage generation circuit and the antifuse writing is performed by using the generated internal write voltage.

12. The semiconductor memory device according to claim 11, wherein the first internal power supply generation circuit is controlled to a slow mode in which a speed of a response operation that causes a first internal power supply level, which is to be boosted, to follow a desired level is decreased when the memory is in a standby state and controlled to a fast mode in which the speed of the response operation is increased when the memory is in an active state, and the antifuse write control circuit controls the first internal power supply generation circuit to the fast mode during antifuse writing.

13. The semiconductor memory device according to claim 10, further comprising
    a self-refresh control circuit that successively executes a refresh operation of memory cells at a predetermined period when power is turned on; and
    the antifuse write control circuit performs control so as to prohibit the refresh operation of the self-refresh control circuit during antifuse writing.

14. The semiconductor memory device according to claim 2, wherein the first internal power supply generation circuit operates in the fast mode during antifuse writing.

15. A semiconductor memory device to which an external power supply voltage is applied, comprising:
    a first internal power supply generation circuit that boosts the external power supply voltage to generate a first internal power supply;
    a memory core to which the first internal power supply is supplied;
    an antifuse memory in which predetermined information is written; and
    a write voltage generation circuit that boosts the first internal power supply to generate an antifuse write voltage,
    wherein writing to an antifuse of the antifuse memory is performed by applying the antifuse write voltage thereto
    wherein the first internal power supply generation circuit operates in a slow mode where a response speed for generating the first internal power supply is decreased when the memory is in a standby state, and operates in a fast mode where the response speed is increased when the memory is in an active state.

16. The semiconductor memory device according to claim 15, wherein the semiconductor memory device includes an antifuse write control circuit for controlling the first internal power supply generation circuit to the fast mode during antifuse writing.

* * * * *